(12) United States Patent
Ogawa et al.

(10) Patent No.: US 6,683,245 B1
(45) Date of Patent: Jan. 27, 2004

(54) ELECTROMAGNETIC SHIELD

(75) Inventors: Ichiro Ogawa, Kanagawa (JP); Isao Nakajo, Kanagawa (JP)

(73) Assignee: Sony Corporation (JP)

( * ) Notice: Subject to any disclaimer, the term of this patent is extended or adjusted under 35 U.S.C. 154(b) by 777 days.

(21) Appl. No.: 09/005,836

(22) Filed: Jan. 12, 1998

(30) Foreign Application Priority Data

Jan. 13, 1997 (JP) ............................................. P9-004028

(51) Int. Cl.[7] ................................................. H05K 9/00
(52) U.S. Cl. .................... 174/35 MS; 174/35 GC; 361/818; 361/753; 257/660
(58) Field of Search ....................... 174/35 MS, 35 GC, 174/35 R; 361/816, 818, 753; 257/665, 660

(56) References Cited

U.S. PATENT DOCUMENTS

| 5,550,713 A | * | 8/1996 | Pressler et al. ............. 361/818 |
| 5,639,989 A | * | 6/1997 | Higgins, III ........... 174/35 MS |
| 5,672,844 A | * | 9/1997 | Persson et al. ........... 174/35 R |
| 5,867,371 A | * | 2/1999 | Denzene et al. ............ 361/816 |

* cited by examiner

Primary Examiner—Thomas G. Black
Assistant Examiner—Ronnie Mancho
(74) Attorney, Agent, or Firm—Rader, Fishman & Grauer PLLC; Ronald P. Kananen

(57) ABSTRACT

An electromagnetic shield is provided for locally shielding an unwanted radiation source. A ground pattern is extended on a printed circuit board for surrounding the unwanted radiation source. A rib is extended in an upper case in a pattern corresponding to the ground pattern. A conductive coating is formed over an inner surface of the upper case including the rib.

27 Claims, 3 Drawing Sheets

ELECTROMAGNETIC SHIELD

BACKGROUND OF THE INVENTION

1. Field of the Invention

The present invention relates to electromagnetic shielding of an electrical apparatus wherein an enclosure made of non-conductive material such as a resin accommodates a circuit board with various circuit devices.

2. Description of the Related Art

An electrical apparatus produces unexpected electromagnetic radiation (referred to as unwanted radiation in the following description). Considering environmental effects of unwanted radiation, each country has legal regulations providing an acceptable level of radiation. It is therefore desired for electrical apparatus to reduce unwanted radiation down below a prescribed level in a targeted country.

Conductive coating of an inner surface of an enclosure is known for shielding of unwanted radiation produced in an electrical apparatus so as to prevent the radiation from leaking outside. This method of shielding allows in principle the entire enclosure to be a closed electromagnetic shielding space. It is thus possible to prevent leakage of unwanted radiation whose source is in the enclosure.

However, an electrical apparatus enclosure generally has openings for displays and keypads and so on. The openings act as outlets for unwanted radiation and therapy reduce the benefit of electromagnetic shielding. A metal shielding case has been therefore used for enclosing only the unwanted radiation source.

However, the addition of shielding case requires additional fabrication and installation steps. Manufacturing costs of the apparatus as a whole thus increase.

SUMMARY OF THE INVENTION

It is an object of the invention to provide electromagnetic shielding allowing unwanted radiation from an electrical apparatus to be locally shielded.

An electromagnetic shield is provided for an electrical apparatus having a circuit board with circuit devices accommodated in an enclosure made of non-conductive material. The electromagnetic shield comprises: a first conductor pattern maintained at a fixed potential, extended on the circuit board to surround a source of unwanted electromagnetic radiation among the circuit devices; a rib structure extended over an inner surface of the enclosure and corresponding to the conductor pattern; and a conductive coating for coating at least a region of the inner surface of the enclosure from a top of the rib structure to a section surrounded by the rib structure.

The present invention may be further configured such that a second conductor pattern with a shape corresponding to the first conductor pattern is formed on another surface of the circuit board while the second conductor pattern and the first conductor pattern are electrically connected to each other with through holes; a second-rib structure with a shape corresponding to the rib structure is extended over an inner surface of the enclosure on another-side of the circuit board; and a second conductive coating coats at least a region of the inner surface of the enclosure from a top of the second rib structure to a section surrounded by the second rib structure.

The conductive coatings of the invention may be formed through coating of conductive agent, for example.

The electromagnetic shield of the invention allows the conductor pattern to be brought to absolute contact with the top of the rib structure coated with the conductive coating when the circuit board is installed in the enclosure. As a result, an electromagnetic shielding space surrounding the source of unwanted electromagnetic radiation is locally formed in the enclosure. In addition to this structure, the electromagnetic shielding of another aspect of the invention allows the second conductor pattern to be brought to absolute contact with the top of the second rib structure coated with the conductive coating when the circuit board is installed in the enclosure. As a result, an electromagnetic shield space is formed over both sides of the circuit board.

The foregoing and other objects, features, aspects and advantages of the present invention will become more apparent from the following detailed description of the invention when taken in conjunction with the accompanying drawings.

DESCRIPTION OF THE PREFERRED EMBODIMENT

A preferred embodiment of the present invention will now be described in detail with reference to the accompanying drawings.

Figure 1:
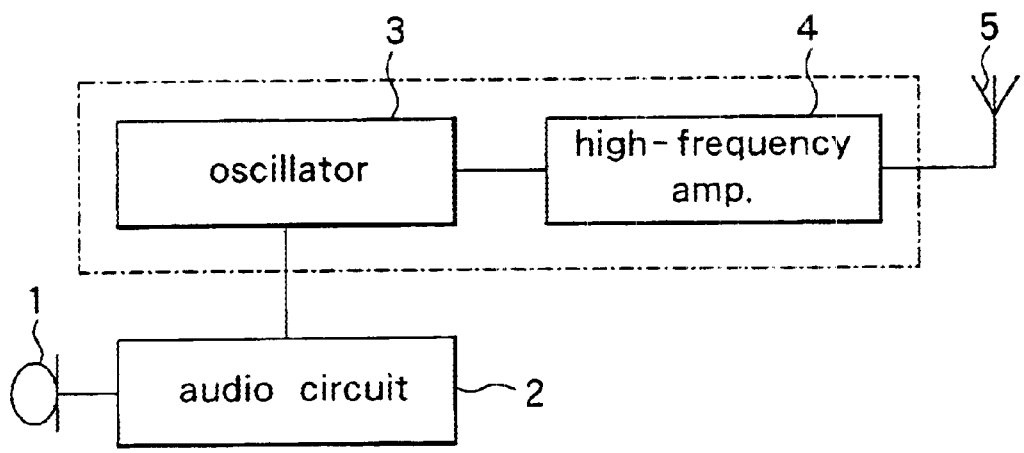
FIG. 1 is a schematic diagram of an wireless microphone transmitter to which the electromagnetic shield of the invention is applied.

FIG. 1 is a schematic diagram of an wireless microphone transmitter to which the electromagnetic shield is applied. The wireless microphone transmitter comprises: a microphone 1 for voice input in a form of an electrical signal; an audio circuit 2 for processing inputted voice signals; an oscillator 3 for carrier wave producing and modulation and so on for signals outputted from the audio circuit 2; a high-frequency amplifier 4 for high-frequency amplification of signals outputted from the oscillator 3; and an antenna 5 for radiating signals output from the high-frequency amplifier 4 into space in a form of transmitted radio waves. In the wireless microphone transmitter of the embodiment, unwanted radiation is mainly produced in the oscillator 3 and the high-frequency amplifier 4. The oscillator 3 and the high-frequency amplifier 4 are thus called a source of unwanted radiation 6 in the embodiment of FIG. 2.

Figure 2:
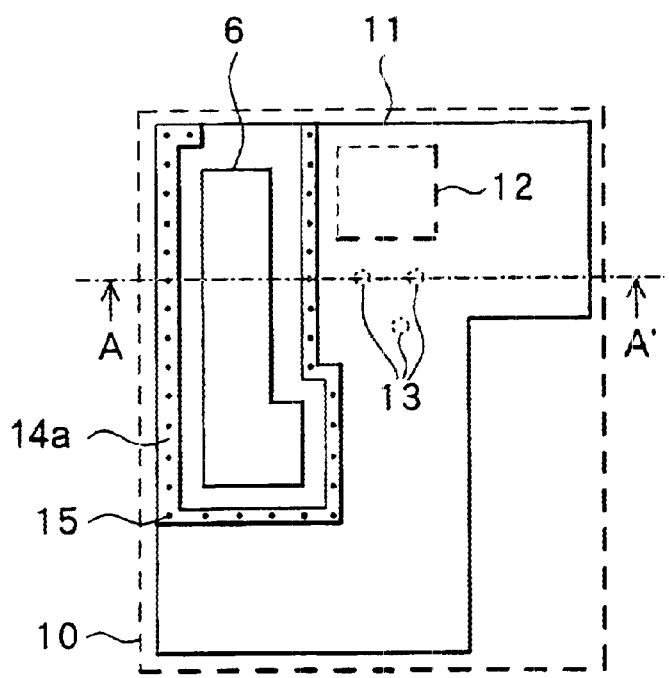
FIG. 2 is a plan view of the electromagnetic shield applied to the wireless microphone transmitter of FIG. 1.

FIG. 2 is a plan view of the wireless microphone transmitter of FIG. 1. As shown in FIG. 2, the wireless microphone transmitter has a printed circuit board 11 installed in an enclosure 10. In the figure the enclosure 10 is simply shown with a broken line. The printed circuit board 11 is equipped with the audio circuit 2, the antenna 5 (not shown in FIG. 2) and the unwanted radiation source 6 (the oscillator 3 and the high-frequency amplifier 4). The microphone 1 in FIG. 1 is connected to the printed circuit board 11 with a connector not shown. The enclosure 10 is made of molded resin of low costs. However, molded resin without conductivity does not provide electromagnetic shielding. The enclosure 10 has a window 12 for a liquid crystal display and holes 13 for switches. It is therefore required to prevent unwanted radiation leaking through the openings.

Figure 3:
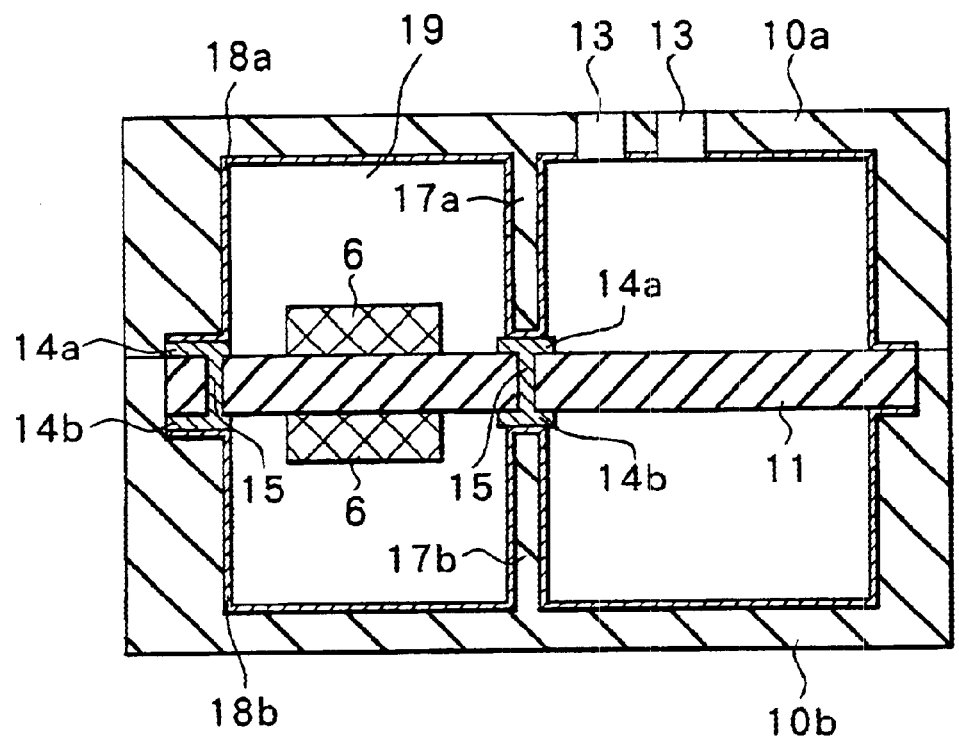
FIG. 3 is a cross section of FIG. 2 showing the electromagnetic shield.
Figure 4:
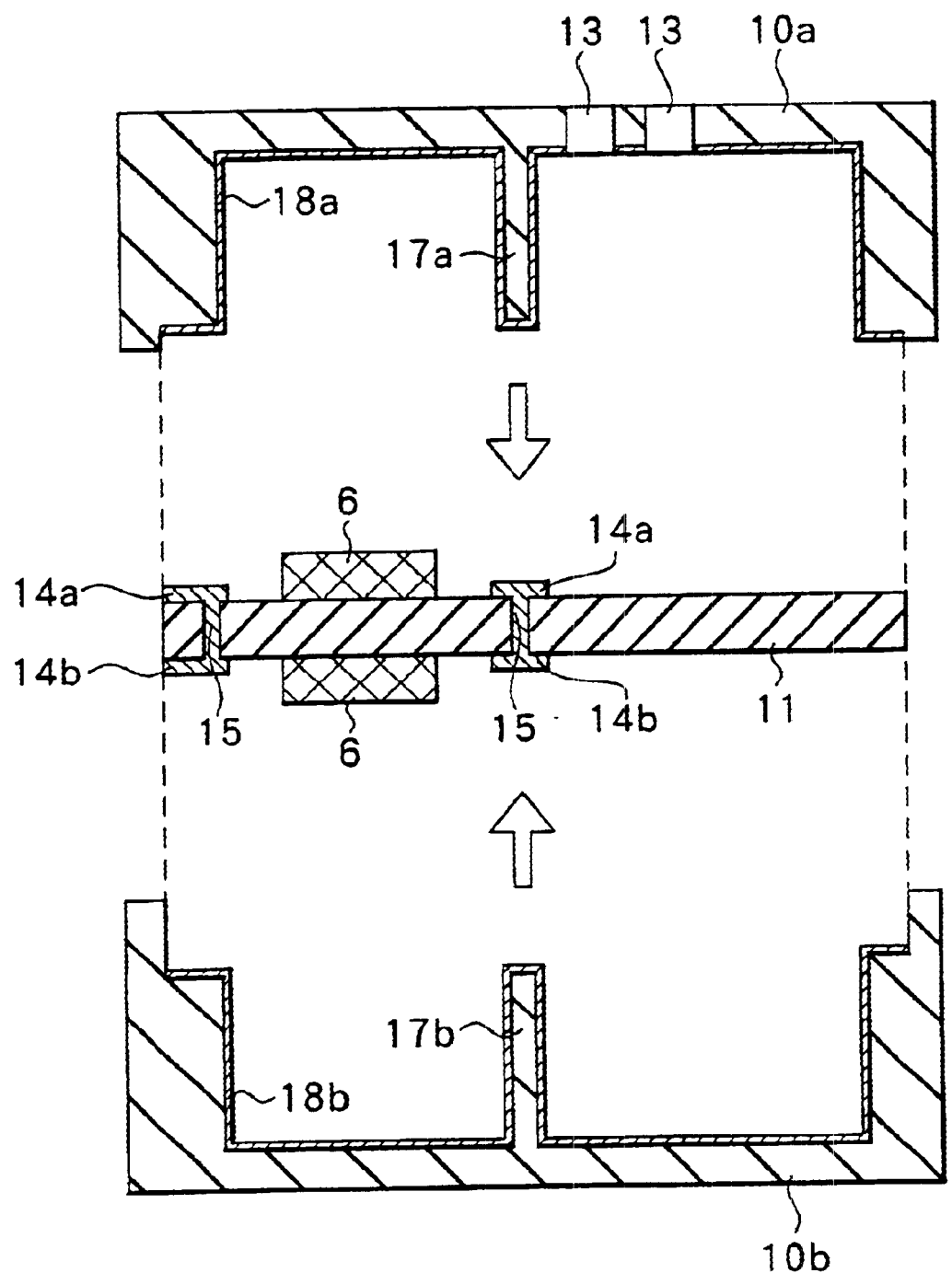
FIG. 4 is a cross section of the electromagnetic shield of FIG. 2 before a printed circuit board is installed therein.

FIG. 3 is a cross section taken along line A–A' of FIG. 2.
FIG. 4 is a cross section taken along line A–A' of FIG. 2 before installation of the printed circuit board 11 in the enclosure 10. As shown in FIGS. 2 to 4, the embodiment provides a conductor pattern 14a, a rib 17a and a conductive coating 18a for preventing unwanted radiation leaking through openings such as the window 12 and the holes 13. The conductor pattern 14a of the order of 2 mm in width, for example, is formed on a surface of the printed circuit board 11 and grounded to surround the unwanted radiation source 6. The rib 17a is extended inside an upper case 10a forming an upper half of the enclosure 10. The rib 17a is formed in a pattern matching the conductor pattern 14a. The conductive coating 18a is further formed all over an inner surface of the upper case 10a.

The rib 14a is easily molded in integration with the upper case 10a. Manufacturing costs are thus reduced. Alternatively the rib 14a may be separately formed and fixed to the inner surface of the upper case 10a. As shown in FIG. 3, a height of the rib 17a is determined such that the top thereof (or a surface of the conductive coating 18a covering the top, exactly) is brought into absolute contact with the printed circuit board 11 (or a surface of the conductor pattern 14a).

The structure described so far is applied to a rear surface of the printed circuit board 11 as well. That is, a conductor pattern 14b is formed on the rear surface of the printed circuit board 11, which corresponds to the conductor pattern 14a. A rib 17b is extended inside a lower case 10b forming a lower half of the enclosure 10. The rib 17b is formed in a pattern matching the ground pattern 14b. Conductive coating 18b is further formed all over an inner surface of the lower case 10b. Furthermore, a plurality of through holes 15 are provided for electrically connecting the conductor patterns 14a and 14b to each other.

The conductive coatings 18a and 18b are formed by coating of an agent. For example, as an agent for the conductive coating 18a, Shintron E-3063 or E-3073 of Shinto Chemitron may be used. A thickness of the coating can be approximately 30 μm, for example. Besides the nickel base shield coating agent of the example, a copper base agent may also be used.

In the structure described so far, the unwanted radiation 6 corresponds to unwanted electromagnetic radiation source of the invention. The ground pattern 14a corresponds to a conductor pattern of the invention. The ground pattern 14b corresponds to a second conductor pattern of the invention. The rib 17a corresponds to a rib structure of the invention. The rib 17b corresponds to a second rib structure of the invention. The conductive coatings 18a and 18b corresponds to a conductive coating and a second conductive coating of the invention, respectively.

As shown in FIG. 4, the printed circuit board 11 is sandwiched between the upper case 10a and the lower case 10b when installed in the enclosure 10. Consequently, as shown in FIG. 3, the top of the rib 17a coated with the conductive coating 18a is brought into absolute contact with the ground pattern 14a when the printed circuit board 11 is installed in the enclosure 10. The top of the rib 17b coated with the conductive coating 18b is brought into absolute contact with the conductor pattern 14b as well. As a result, an electromagnetic shielding space 19 surrounding the source of unwanted radiation 6 is created locally in the enclosure 10. In the embodiment described so far the source of unwanted radiation 6 is located on both surfaces of the printed circuit board 11. The unwanted radiation 6 may be on either of the surfaces of the printed circuit board 11.

As described so far, the embodiment provides: the conductor pattern 14a formed on the printed circuit board 11 for surrounding the source of unwanted radiation 6; the rib 17a formed in the upper case 10a in a pattern corresponding to the ground pattern 14a; and the conductive coating 18a formed over the inner surface of the upper case 10a including the rib 14a. Consequently, the conductor pattern 14a is in absolute contact with the rib 17a when the printed circuit board 11 is installed in the enclosure 10. As a result, the electromagnetic shielding space 19 is locally formed for surrounding the unwanted radiation source 6. Unwanted radiation from the unwanted radiation source 6 is thus prevented from leaking through openings such as the window 12 for a liquid crystal display and the holes 13 for switches. Moreover, the electromagnetic shielding isolates the source of unwanted radiation 6 from other circuit blocks and a wire harness and so on placed on the printed circuit board 11. An effect of unwanted radiation on the other circuit blocks is thus reduced.

Furthermore, the embodiment provides conductor patterns 14a and 14b on both surfaces of the printed circuit board 11 while still connected to each other. The ribs 17a and 17b are each formed in the upper case 10a and the lower case 10b, respectively. As a result, the electromagnetic shielding space 19 is created over both surfaces of the printed circuit board 11. It is therefore possible to provide effective electromagnetic shielding when the sources of unwanted radiation 6 are located on both surfaces of the printed circuit board 11.

The present invention is not limited to the embodiment described above but may be practiced in still other ways within the scope of the invention. The embodiment provides the ground patterns 14a and 14b on both surfaces of the printed circuit board 11 and the ribs 17a and 17b each formed in the upper case 10a and the lower case 10b, respectively. The electromagnetic shielding space 19 is thus created over both surfaces of the printed circuit board 11. If the unwanted radiation source 6 is located only on one surface, the conductor pattern and the rib may be formed only on the one surface to form the electromagnetic shielding space. In this case it is preferred that the conductor pattern is formed on the other surface of the printed circuit board 11 (the reverse of the surface where the unwanted radiation source 6 is located), entirely over a region corresponding to a section surrounded by the conductor pattern 14a on the front surface. The embodiment provides the conductive coatings 18a and 18b entirely over the inner surface of the upper case 10a and the lower case 10b. Alternatively, electromagnetic shielding of the unwanted radiation source 6 is achieved by forming the conductive coating at least from the top of the rib 17a (or 17b) to a region surrounded by the rib 17a (or 17b) inside the upper case 10a and the lower case 10b. Besides coating of an agent, the conductive coatings 18a and 18b may be formed by any other method such as plating or spreading of a metal sheet.

The electromagnetic shielding of the invention may be applied to any electrical apparatus besides the wireless microphone transmitter illustrated in the foregoing embodiment.

According to the electromagnetic shield of the invention as described so far, the conductor pattern is extended on the printed circuit board for surrounding the unwanted radiation source. The rib is extended in the enclosure in a pattern corresponding to the conductor pattern. The conductive coating is formed at least a region of the inner surface of the enclosure from a top of the rib structure to a section surrounded by the rib structure. The conductor pattern is brought to absolute contact with the top of the rib coated with the conductive coating when the printed circuit board is installed in the enclosure. As a result, the electromagnetic shielding space is locally formed in the enclosure for surrounding the unwanted radiation source.

The invention further allows the electromagnetic shielding of nearly identical structures on both surfaces of the printed circuit board. The electromagnetic shielding space is thus created on both sides of the printed circuit board. This structure provides more effective shielding.

Obviously many modifications and variations of the present invention are possible without departing from the spirit and scope of the invention. The scope of the invention is to be determined solely by the appended claims.

What is claimed is:

1. An electromagnetic shield comprising:
   a first case having a first conductive coating;
   second case having a second conductive coating, said second case mating with said first case to form an enclosure, said enclosure having a first cavity and a second cavity;
   a rib structure isolating said first cavity from said second cavity, said rib structure having a first rib extending from said first case and a second rib extending from said second case;
   at least one circuit device enclosed within said first cavity;
   a conductive coating encasing said at least one circuit device, said conductive coating having a first conductive coating on said first case and a second conductive coating on said second case, said first conductive coating being in electrical contact with said second conductive coating.

2. The electromagnetic shield according to claim 1, wherein said circuit device is a source of unwanted electromagnetic radiation and said first cavity is an electromagnetic shielding space, said electromagnetic shielding space surrounding said source of unwanted electromagnetic radiation.

3. The electromagnetic shield according to claim 1, wherein said conductive coating is disposed on an inner surface of said enclosure.

4. The electromagnetic shield according to claim 1, wherein said first conductive coating is on said first rib and said second conductive coating is on said second rib.

5. The electromagnetic shield according to claim 1, wherein said rib structure has a first rib extending from said first case and a second rib extending from said second case.

6. The electromagnetic shield according to claim 1, wherein said enclosure is formed from a non-conductive material.

7. The electromagnetic shield according to claim 1, wherein said first conductive coating is formed through plating.

8. The electromagnetic shield according to claim 1, wherein said first conductive coating is formed through spreading of a metal sheet.

9. The electromagnetic shield according to claim 1, wherein said first conductive coating is formed through a conductive agent.

10. The electromagnetic shield according to claim 1, wherein an opening extends from an exterior surface of said enclosure to said second cavity.

11. The electromagnetic shield according to claim 10, wherein said opening extends from said exterior surface through said conductive coating.

12. The electromagnetic shield according to claim 1, wherein at least a portion of said circuit board is enclosed within said first cavity.

13. The electromagnetic shield according to claim 12, wherein at least another portion of said circuit board is enclosed within said second cavity.

14. The electromagnetic shield according to claim 1, wherein said at least one circuit device is mounted on a circuit board, said circuit board having a first side and a second side opposite to said first side.

15. The electromagnetic shield according to claim 14, wherein said first conductive coating, a portion of a circuit board and said circuit device are enclosed within said first cavity.

16. The electromagnetic shield according to claim 15, wherein at least another portion of said circuit board is enclosed within said second cavity.

17. The electromagnetic shield according to claim 15, wherein said circuit board has one of said at least one circuit device on said first side.

18. The electromagnetic shield according to claim 17, wherein said circuit board has another one of said at least one circuit device on said second side.

19. The electromagnetic shield according to claim 14, further comprising a conductive pattern, said conductive pattern including a first conductive pattern on a first side and a second conductive pattern on a second side.

20. The electromagnetic shield according to claim 19, wherein said conductive pattern is maintained at a fixed potential.

21. The electromagnetic shield according to claim 19, wherein said rib structure has a shape corresponding to said conductive pattern, said rib structure being in electrical contact with said conductive pattern.

22. The electromagnetic shield according to claim 19, wherein said first conductive pattern is in electrical contact with said first conductive coating and said second conductive pattern is in contact with said second conductive coating.

23. The electromagnetic shield according to claim 19, wherein said second conductive pattern is electrically connected to said first conductive pattern with through at least one hole.

24. The electromagnetic shield according to claim 1, wherein said inner surface of said first cavity is coated with said first conductive coating.

25. The electromagnetic shield according to claim 24, wherein said first rib structure is coated with said first conductive coating.

26. The electromagnetic shield according to claim 24, wherein said inner surface of said second cavity is coated with said first conductive coating.

27. An electrical apparatus having a circuit board with circuit devices, said apparatus comprising the electromagnetic shield of claim 1.

* * * * *